United States Patent
Craig et al.

(10) Patent No.: US 7,262,498 B2
(45) Date of Patent: *Aug. 28, 2007

(54) ASSEMBLY WITH A RING AND BONDING PADS FORMED OF A SAME MATERIAL ON A SUBSTRATE

(75) Inventors: David M. Craig, Albany, OR (US); Chien-Hua Chen, Corvallis, OR (US); Charles C. Haluzak, Corvallis, OR (US); Ronnie J. Yenchik, Blodgett, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/038,374

(22) Filed: Jan. 18, 2005

(65) Prior Publication Data

US 2006/0081994 A1  Apr. 20, 2006

Related U.S. Application Data

(60) Provisional application No. 60/620,529, filed on Oct. 19, 2004.

(51) Int. Cl.
*H01L 23/48* (2006.01)
*H01L 21/44* (2006.01)

(52) U.S. Cl. .............. 257/704; 257/E23.075; 257/E23.185; 257/E23.069; 257/E23.068; 257/E23.19; 257/E25.023; 257/772; 257/706; 257/707; 257/712; 257/713; 257/434; 257/458; 257/479; 257/460; 257/788; 257/797; 257/734; 257/787; 257/710; 257/728; 385/93; 385/52; 385/91; 361/718; 174/257

(58) Field of Classification Search ........ 257/E23.075, 257/E23.185, E23.069, E23.086, E23.19, 257/E25.023, 772, 659, 660, 779, 706, 707, 257/712, 713, 434, 458, 479, 460, 788, 797, 257/787, 676, 704, 710, 666, 696, 698, 673, 257/738, 734, 724, 725, 728, 762–765, 767, 257/782, 784, 786, 355, 357
See application file for complete search history.

(56) References Cited

U.S. PATENT DOCUMENTS

| | | | |
|---|---|---|---|
| 5,869,903 A | 2/1999 | Nakatani et al. | |
| 6,053,395 A | 4/2000 | Sasaki | |
| 6,105,226 A * | 8/2000 | Gore et al. ............... | 29/25.35 |
| 6,343,087 B2 | 1/2002 | Yamamoto | |
| 6,393,171 B2 | 5/2002 | Sasaki et al. | |
| 6,500,760 B1 | 12/2002 | Peterson et al. | |
| 6,521,477 B1 * | 2/2003 | Gooch et al. ............. | 438/106 |
| 6,620,720 B1 * | 9/2003 | Moyer et al. ............. | 438/612 |
| 6,734,504 B1 | 5/2004 | Lie et al. | |
| 6,744,071 B2 | 6/2004 | Sano et al. | |
| 2001/0023980 A1 * | 9/2001 | Ohmori .................... | 257/678 |
| 2002/0000646 A1 | 1/2002 | Gooch et al. | |
| 2004/0016995 A1 | 1/2004 | Kuo et al. | |
| 2004/0052468 A1 * | 3/2004 | Pham et al. ............... | 385/52 |
| 2005/0013562 A1 * | 1/2005 | Tatehata et al. .......... | 385/93 |
| 2005/0051356 A1 * | 3/2005 | Sumi et al. ............... | 174/257 |
| 2005/0167795 A1 * | 8/2005 | Higashi .................... | 257/678 |
| 2005/0199998 A1 * | 9/2005 | Chen et al. ............... | 257/706 |

(Continued)

*Primary Examiner*—Alexander Oscar Williams

(57) ABSTRACT

An assembly includes a substrate, a device coupled to the substrate; a ring formed on the substrate; and one or more bonding pads formed on the substrate, wherein the ring and bonding pads are formed of a same material.

20 Claims, 5 Drawing Sheets

U.S. PATENT DOCUMENTS

2005/0232547 A1* 10/2005 Boudreau et al. ............. 385/52
2006/0001123 A1* 1/2006 Heck et al. ................. 257/528
2006/0128064 A1* 6/2006 Chen et al. ................. 438/113

* cited by examiner

US 7,262,498 B2

ASSEMBLY WITH A RING AND BONDING PADS FORMED OF A SAME MATERIAL ON A SUBSTRATE

RELATED APPLICATIONS

The present application claims priority under 35 U.S.C. § 119(e) from the following previously-filed Provisional Patent Application, U.S. Application No. 60/620,529, filed Oct. 19, 2004 by David M. Craig et al., entitled "Assembly".

BACKGROUND

Electrical connections to integrated circuits and micro-electromechanical (MEMS) devices are often made through aluminum pads. In particular, gold wires frequently extend from the MEMS devices and are coupled to external circuits via aluminum pads. Connecting gold wires directly to aluminum pads is typically achieved by the use of wire bonding and/or the application of thermosonic energy to attach the wires. This thermosonic energy may be harmful to some fragile MEMS devices. Further, aluminum pads may be subject to corrosion in certain environments, which can cause early device failure.

BRIEF DESCRIPTION OF THE DRAWINGS

The accompanying drawings illustrate various embodiments of the present apparatus and method and are a part of the specification. The illustrated embodiments are merely examples of the present apparatus and method and do not limit the scope of the disclosure.

Throughout the drawings, identical reference numbers designate similar, but not necessarily identical, elements.

DETAILED DESCRIPTION

A system and method are provided herein for forming a seal ring and bonding pads of substantially the same material on a substrate at substantially the same time. The seal ring is used to couple a glass lid or cover to the substrate while the bonding pads may be used to couple device leads to circuit leads.

As used in the present specification and the appended claims, the term "hermetic seal" is meant to be understood as any seal that is substantially impervious to moisture and gases. A "photo resist" is meant to be understood as any photo-active polymer or material that may become more or less soluble in a particular solvent due to a physical or chemical change after exposure to light, electromagnetic radiation, or high energy particle beams. "Exposure" is meant to be understood as a process in which photo resist is selectively subjected to light or electromagnetic radiation or a particle beam and subsequently experiences a physical or chemical change. The term "develop" is meant to be understood as a process in which a solvent or developer is introduced to a previously exposed photo resist in order to remove a portion of the photo resist. The term "developer" is meant to denote a solution in which a previously exposed photo resist may be developed.

In the following description, for purposes of explanation, numerous specific details are set forth in order to provide a thorough understanding of the present method and apparatus. It will be apparent, however, to one skilled in the art, that the present method and apparatus may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

General Electronic Device with a Micro-Electromechanical System Assembly

Figure 1:
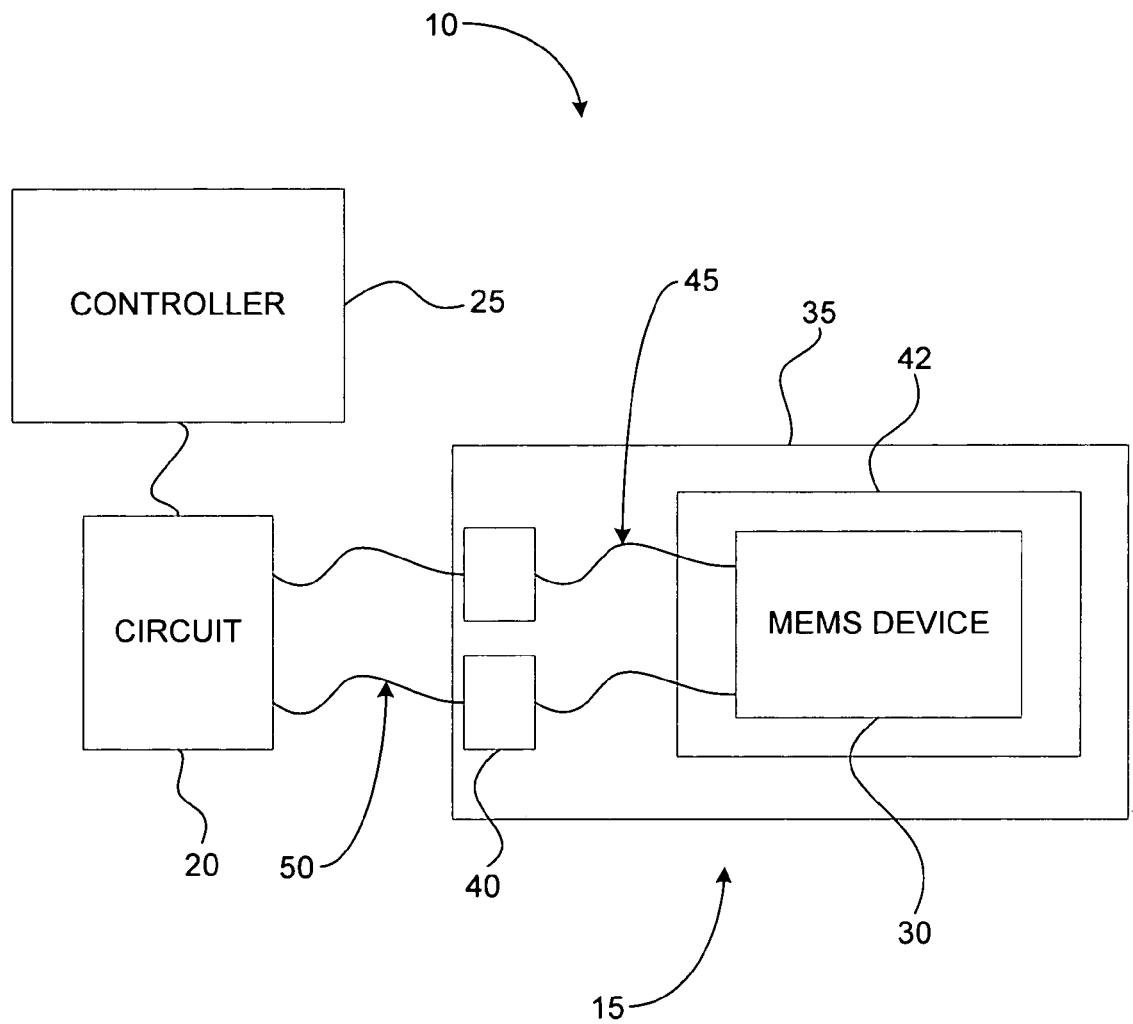
FIG. 1 is a schematic of an electronic device according to one exemplary embodiment.

FIG. 1 illustrates an electronic device (10) that includes a system assembly, such as a micro-electro mechanical system assembly (MEMS assembly) (15), coupled to a circuit (20). The circuit (20) is in turn coupled to a controller (25). The controller (25) selectively sends electrical signals to the circuit (20), which in turn conveys the signals to the MEMS assembly (15). In particular, according to one exemplary embodiment, the MEMS assembly (15) includes a MEMS device (30) that is coupled to the circuit (20). The MEMS device (30) is operated in response to the signals conveyed thereto by the controller (25) by way of the circuit (20). In other embodiments, the MEMS device (30) may be replaced by a suitable integrated circuit or other semiconductor device.

The circuit (20) and controller (25) shown are each coupled to a single MEMS assembly (15). However, any suitable number of circuits, MEMS assemblies, and/or controllers may similarly be used in the electronic device (10). For ease of explanation, a tape automated bonding (TAB) circuit will be referenced throughout the detailed description. A TAB circuit includes TAB circuit leads that are patterned on a multilayer polymer tape. The tape is positioned above the MEMS assembly (15) so that the metal tracks (on the polymer tape) correspond to and are aligned with the bonding pads (40) on the MEMS assembly (15).

As shown in FIG. 1, the MEMS device (30) is coupled to a substrate (35). The substrate (35) has a hermetically sealed cover (42) coupled thereto that covers the MEMS device (30) to protect the MEMS device from damage or contamination and/or to maintain the desired operating environment. The MEMS assembly (15) also includes a plurality of bonding pads (40). The bonding pads (40) couple the MEMS device (30) to the circuit (20) and consequently to the controller (25). More specifically, a plurality of MEMS leads (45) extend from the MEMS device (30) and to the bonding pads (40). Additionally, a plurality of circuit leads (50) are coupled to the bonding pads (40). As a result, electrical connections are formed between the circuit (20) and the MEMS device (30) through the MEMS leads (45) and the circuit leads (50).

The seal used to connect substrate (35) to the cover (42) is formed of substantially the same material as the bonding pads (40), and in the exemplary methods discussed below, may be formed with the same process steps and masks. This configuration may allow for thermocompression bonding between the MEMS leads (45) and the circuit leads (50) through the bonding pads (40). Further, the circuit (20) used may be a tape-automated bonding (TAB) circuit. A TAB circuit can be gang bonded such that all the electrical connections are made in one step. Exemplary embodiments will now be discussed with reference to FIGS. 2A-5B.

Exemplary Micro-Electro Mechanical Assembly

Figure 2A:
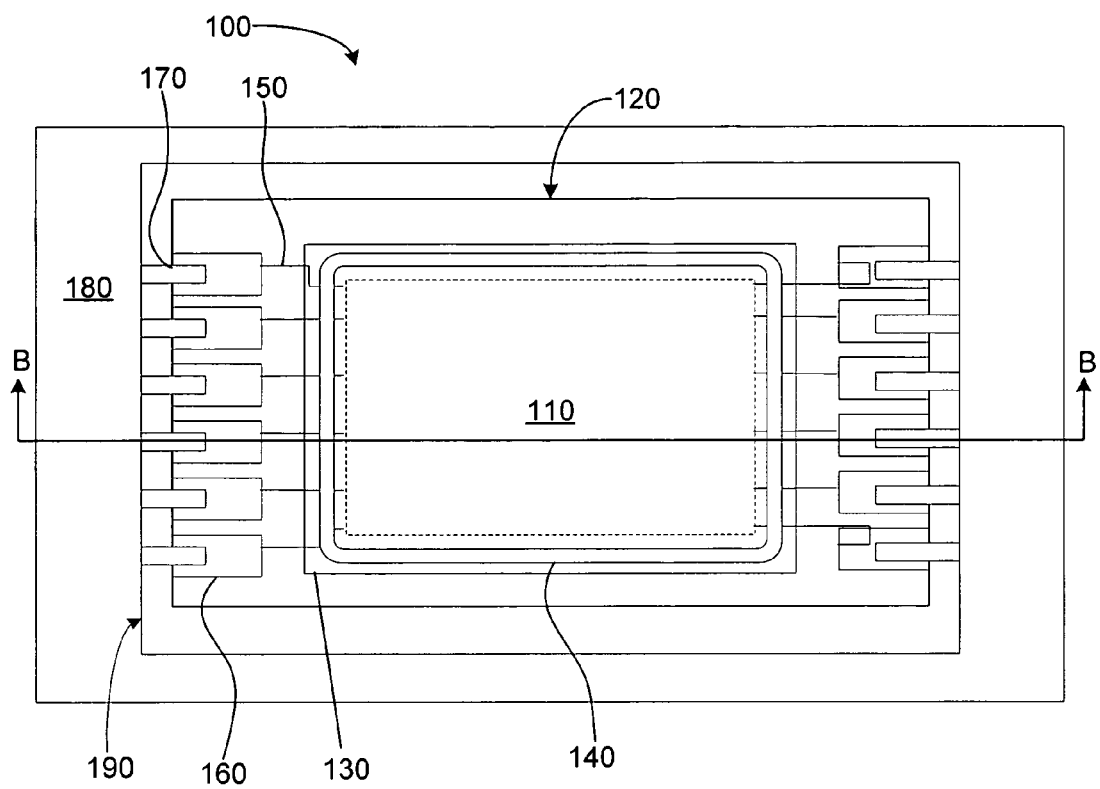
FIG. 2A illustrates a top view of a micro-electromechanical system according to one exemplary embodiment.
Figure 2B:
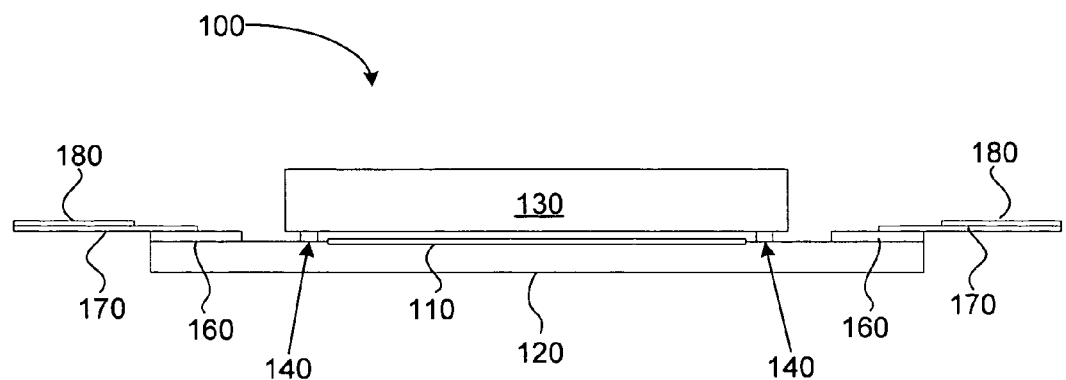
FIG. 2B illustrates a cross sectional view of the micro-electromechanical system shown in FIG. 2A taken along section B-B, according to an example embodiment.

FIGS. 2A-2B illustrate an exemplary MEMS assembly (100) in further detail. In particular, FIG. 2A shows a top view of the MEMS assembly (100) and FIG. 2B shows a cross sectional view of the MEMS assembly (100) taken along section B-B. The MEMS assembly (100) includes a micro-electromechanical device (MEMS device) (110) supported by a substrate (120). In some embodiments, the MEMS device (110) may be replaced by, a suitable integrated circuit or semiconductor device. The MEMS device (110) is covered by a glass lid (130), or other suitable material capable of withstanding the AuSn soldering temperatures, and/or performing other useful functions for the MEMS devices or package. Further, the MEMS device (110) is hermetically sealed with a seal ring (140). MEMS leads (150) extend from the MEMS device (110), below the seal ring (140), and to bonding pads (160). The bonding pads (160) are in turn coupled to circuit leads (170) that couple the bonding pads (160) to a circuit (180). As shown in FIG. 2, the circuit leads (170) extend from the bonding pads (160), across a gap between the MEMS device (110) and the circuit (180) to the edge (190) of the circuit (180).

The MEMS device (110) includes any suitable micro-electromechanical device that may be constructed on a substrate such as a semiconductor, like silicon or other material and which may be fabricated using integrated circuit (IC) batch-processing techniques or other micro-processing techniques. These techniques may include the deposition of a layer of material, placing a photo-resist pattern on the layer of material, and subsequently exposing and developing the exposed layer to selectively etch the exposed material. Further, MEMS devices are not limited to single devices formed on a substrate, but may include several devices formed on a substrate. Such MEMS devices may be broadly classified as sensors, actuators, light modulators, printheads, a combination of these, or added circuitry for processing or control.

The MEMS device (110) shown is formed directly on a lower substrate (120), but can also be formed by the combination of features defined on the substrate (120) and a lid (130), which may also serve as an upper substrate. The substrate (120) provides a stable platform for supporting the MEMS device (110). Further, the substrate (120) provides a stable platform for bonding the MEMS device (110) to the circuit (180). In particular, the substrate (120) may be formed of a thermally stable material that is able to withstand high temperature ranges and that is a good electrical insulator. An exemplary substrate material includes, without limitation, a silicon wafer.

The MEMS assembly (100) shown has a glass lid (130) coupled thereto. In particular, the glass lid (130) is hermetically sealed to the substrate (120) by way of the seal ring (140). The MEMS device (110) is thus contained within an enclosure formed by the substrate (120), the glass lid (130), and the seal ring (140). This configuration helps protect the MEMS device (110) from damage and/or contamination and further allows the operating environment within the enclosure to be at least partially controlled and maintained. In particular, the glass lid (130) protects the MEMS device (110) from contact with other objects. Further, the enclosure is hermetically sealed by the seal ring (140) to maintain whatever environment may be desired for the MEMS device to operate, such as an inert gas.

The seal ring (140) may be formed of any material suitable for hermetically sealing the glass lid (130). One exemplary material includes, without limitation, 80 Au/20 Sn solder. This solder may be a eutectic solder, such that the Au and the Sn are combined in such proportions that the resulting solder has the lowest melting point associated with combining the two metals. The use of a eutectic solder, with its correspondingly low melting point, melts with less heat. As a result, the use of a eutectic solder may help to minimize the possibility that the MEMS device (110) will be damaged due to thermal effects when the glass lid (130) is sealed.

As mentioned previously, the same material used to form the seal ring (140) may be used to form the bonding pads (160). For example, if 80 Au/20 Sn solder is used to form the seal ring (140), 80 Au/20 Sn solder is used to form the bonding pads (160). This type of solder bonding pad (160) reliably couples the MEMS leads (150) to the circuit leads (170).

The MEMS leads (150) are then bonded to MEMS leads (150) by way of the 80 Au/20 Sn solder bonding pads. The MEMS leads (150) may be made of any suitable material including, without limitation, aluminum wires. A conductive material such as titanium or tantalum may be deposited and patterned over the aluminum at the bond pad end of the wire to provide a diffusion barrier between the aluminum and the 80 Au/20 Sn solder. Further, the circuit leads (170) may be made of any suitable material including, without limitation, gold plated copper material. These leads are bonded together at the bonding pads (160). Further, the seal ring (140) and the bonding pads (160) may be formed in the same process.

The electrical connections made to the MEMS device (110) are illustrated as being laid out in a specific configuration, though they may exit the MEMS package in any of a number of configurations (not shown), and later be used to allow electrical signals to enter and exit the MEMS device (110). One exemplary method of forming the MEMS assembly (100) will now be discussed in more detail.

Method of Forming a MEMS Assembly and Coupling the Assembly to a Circuit

Figure 3A:
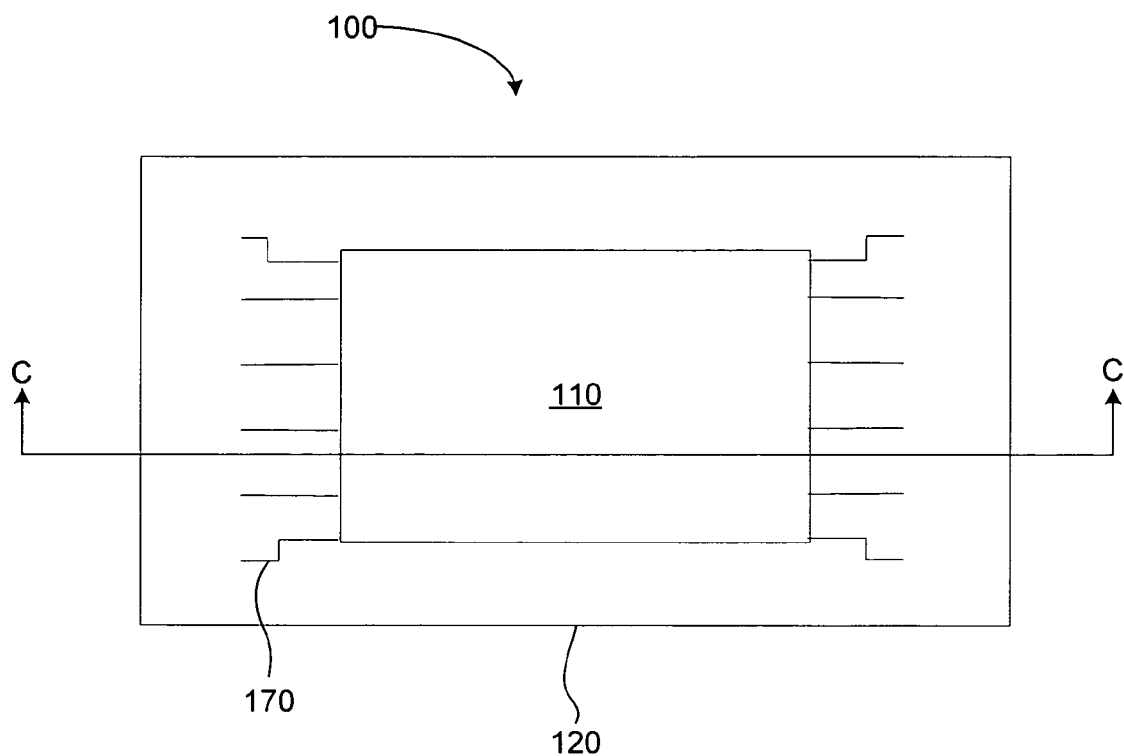
FIG. 3A illustrates a top view of a micro-electromechanical device according to one exemplary embodiment.
Figure 3B:
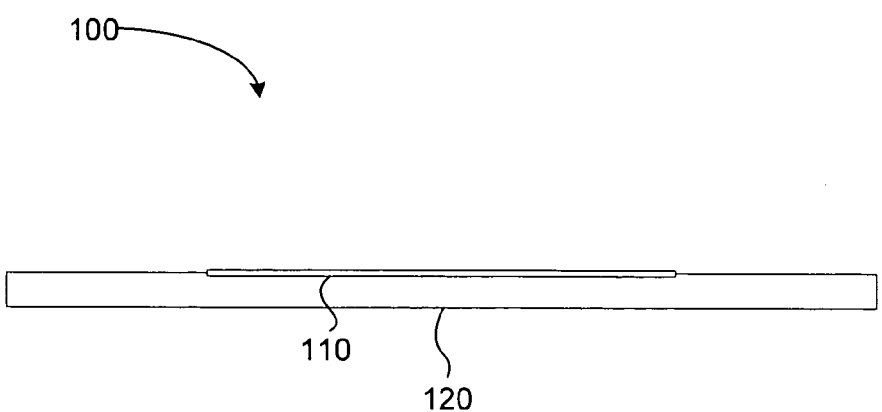
FIG. 3B illustrates a cross sectional view of the micro-electromechanical device on a substrate of FIG. 3A taken along section C-C, according to an example embodiment.

FIGS. 3A-5B illustrate an exemplary method of forming a MEMS assembly (100; FIG. 2A-2B). As shown in FIG. 3A-3B, the method begins by forming a MEMS device (110) on a substrate (120). According to one exemplary embodiment, the MEMS device (110) is formed by selectively depositing layers of semiconductor and/or insulating layers, applying photoresist patterns to the layers, exposing the uncovered portions, and then developing the exposed portions to etch to a desired depth through the layers. Further, while one assembly is shown, any number of MEMS assemblies (100) may be formed simultaneously through the use of a larger substrate. An exemplary substrate material includes, without limitation, silicon or silicon wafers.

The formation of the MEMS device (100) may include the formation of MEMS leads (150) formed on the substrate that extend from the MEMS device (110). The MEMS leads (150) may be formed of any suitable material. One exemplary MEMS leads material includes, without limitation, aluminum. The MEMS leads (150) may have subsequent layers of insulating materials deposited thereon such that a portion of the MEMS leads (150) are covered while leaving the ends distant from the MEMS device (110) exposed. The exposed ends may be covered by a conductive material, such as titanium or tantalum, which provides a diffusion barrier between the aluminum wire and the final bond pad material.

Figure 4A:
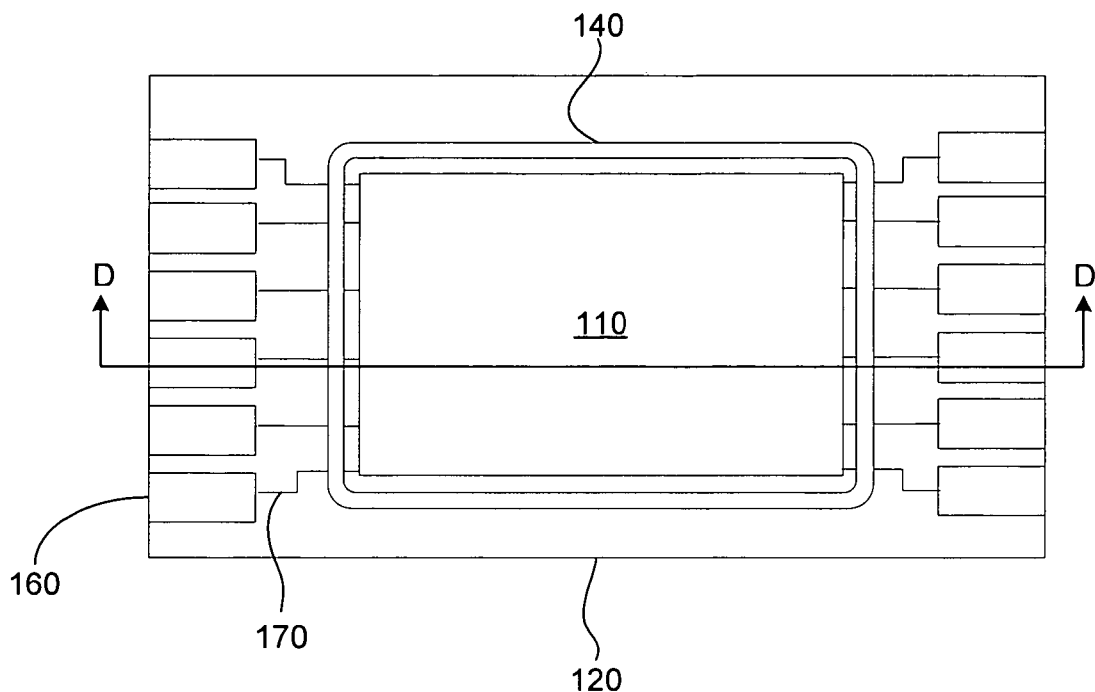
FIG. 4A illustrates a top view of seal ring and bonding pads formed of the same material on the substrate according to one exemplary embodiment.
Figure 4B:
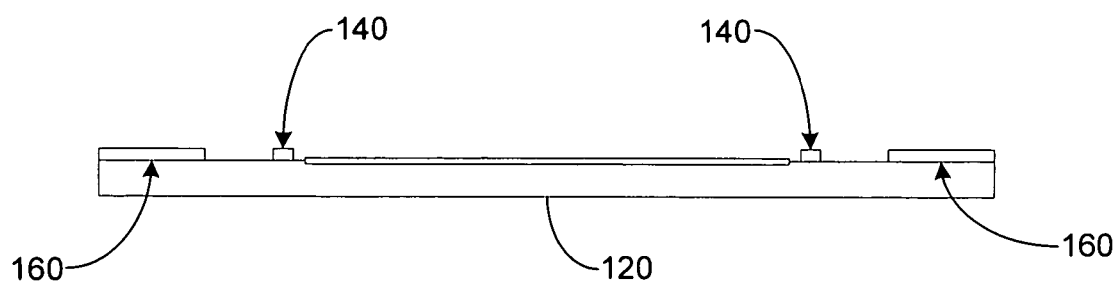
FIG. 4B illustrates a cross sectional view of the seal ring and bonding pads of FIG. 4A taken along section D-D, according to an example embodiment.

As shown in FIGS. 4A-4B, after the MEMS device (110) is formed, including the MEMS leads (150), a layer of material is applied that is suitable for forming both the seal ring (140) and the bonding pads (160). One such material includes, without limitation, 80 Au/20 Sn eutectic solder. Thereafter, the layer of solder is patterned to form the seal ring (140) and the bonding pads (160). Accordingly, the seal ring (140) and the bonding pads (160) are formed at substantially the same time.

As shown in FIGS. 4A-4B, the bonding pads (160) are formed such that the bonding pads (160) are in contact with one end of the MEMS leads (150). The seal ring (140) is formed on top of an insulating layer, such that the seal ring (140) is not in direct contact with the MEMS leads (150). As a result, the seal ring (140) is electrically insulated from the MEMS leads (150).

Figure 5A:
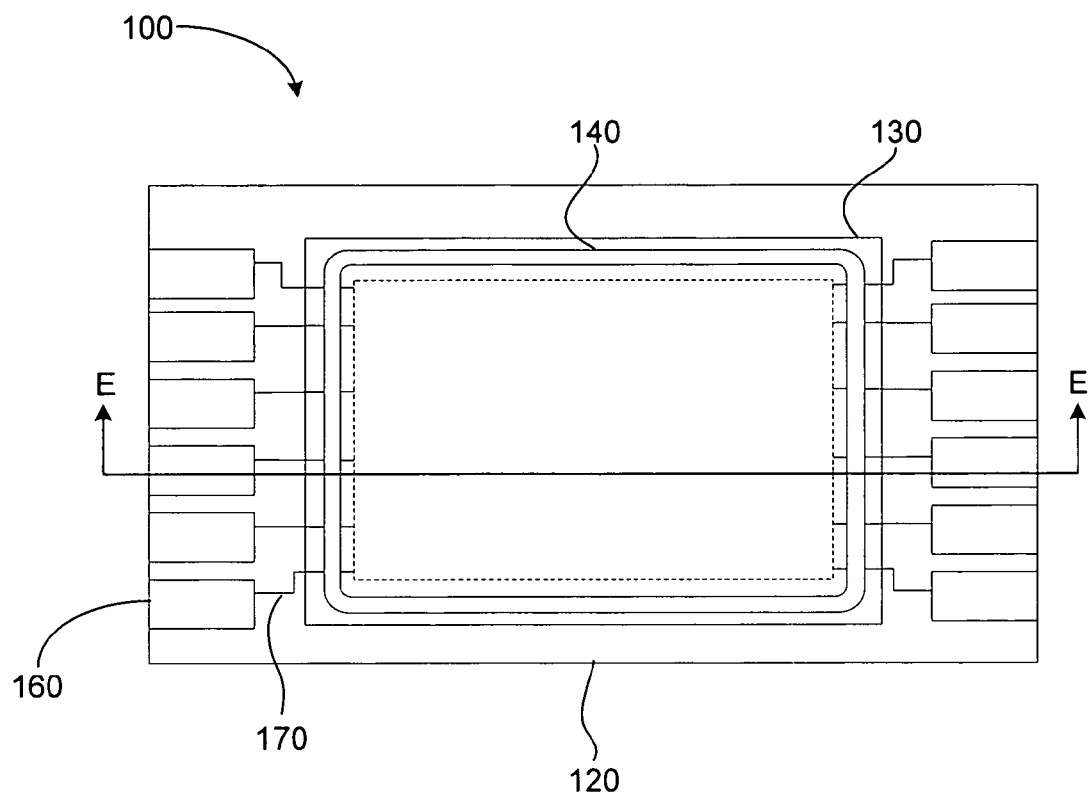
FIG. 5A illustrates a top view of a glass lid placed over a micro-electromechanical device according to one exemplary embodiment.
Figure 5B:
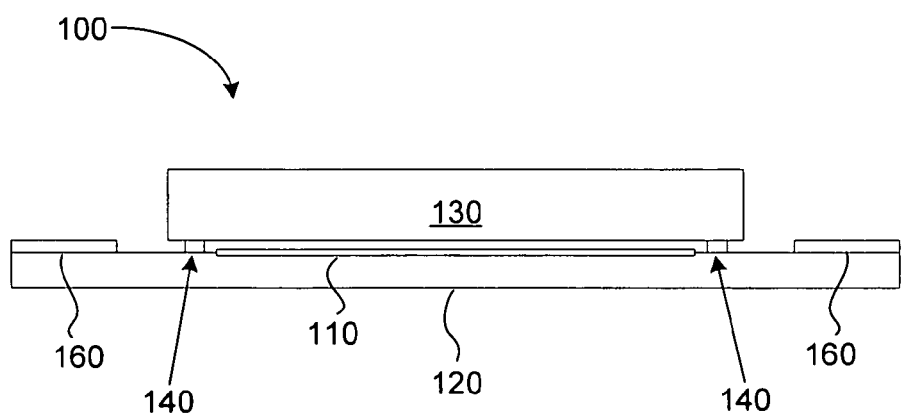
FIG. 5B illustrates a cross sectional view of the glass lid placed over the micro-electromechanical device of FIG. 5A taken along section E-E, according to an example embodiment.

FIGS. 5A-5B illustrate the glass lid (130) coupled to the seal ring (140). This coupling may be achieved by placing the glass lid (130) in contact with the seal ring (140), and then applying heat and/or pressure to cause the material of the seal ring (140) to flow. Upon cooling, the seal ring (140) solidifies, thereby forming a hermetic seal between the glass lid (130) and the substrate (120). As a result, the MEMS device (110) is protected from physical shock and contamination and is contained within the proper operating environment.

Referring once again to FIGS. 2A-2B, once the glass lid (130) has been attached, the MEMS assembly (100) may then be coupled to a circuit (180) by way of the circuit leads (170). In particular, the circuit leads (170) are aligned with respect to the bond pads (160). Thereafter, the circuit leads may be gang bonded, such that all the electrical connections are established at substantially the same time, resulting in the MEMS assembly (100) shown in FIGS. 2A-2B.

The preceding description has been presented only to illustrate and describe the present method and apparatus. It is not intended to be exhaustive or to limit the disclosure to any precise form. Many modifications and variations are possible in light of the above teaching. It is intended that the scope of the disclosure be defined by the following claims.

What is claimed is:

1. An assembly, comprising:
a substrate;
a device coupled to said substrate;
a ring formed on said substrate around said device and extending from said substrate higher than said device such that a cover can be sealed to said ring over said device; and
one or more bonding pads formed on said substrate exterior to and separate from said ring, said bonding pad being formed of a conductive material and configured for making an electrical connection between said device and an external circuit,
wherein said ring and bonding pads are formed of a same material.

2. The assembly of claim 1, wherein said material comprises solder.

3. The assembly of claim 2, wherein said material comprises AuSn solder.

4. The assembly of claim 3, wherein said AuSn solder comprises 80 Au/20 Sn eutectic solder.

5. The assembly of claim 1, and further comprising said cover hermetically sealed to said substrate by said ring.

6. The assembly of claim 5, wherein said cover comprises a glass lid.

7. The assembly of claim 1, and further comprising one or more leads extending between said device and said bonding pads.

8. The assembly of claim 7, wherein at least one of said one or more leads comprise aluminum wires having titanium deposited on at least a portion thereof.

9. An electronic device, comprising:
an substrate having a device supported thereon;
a ring also disposed on said substrate, wherein said ring surrounds said device such that a cover can be sealed to said ring over said device;
bonding pads formed on said substrate exterior to and separate from said ring, said bonding pad being formed of a conductive material and electrically connected to said device, said bonding pads and ring being formed of substantially the same material;
a circuit having circuit leads electrically coupled to said bonding pads; and
a controller coupled to said circuit.

10. The device of claim 9, wherein said circuit comprises a tape-automated bond circuit.

11. The device of claim 9, wherein said bonding pads and said ring are on a single side of said substrate.

12. The device of claim 9, wherein said bonding pads comprise solder.

13. The assembly of claim 1, wherein said device comprises a micro-electromechanical device.

14. The assembly of claim 1, further comprising wire leads connected to said bonding pads, wherein a portion of a wire lead connected to one of said bonding pads comprises a conductive diffusion barrier material deposited on said wire lead.

15. The assembly of claim 14, wherein said diffusion barrier material comprises titanium or tantalum.

16. The assembly of claim 14, wherein said wire lead comprises aluminum wire and said bonding pad comprises solder.

17. The assembly of claim 1, wherein said ring is formed exclusively of a material also used to form said bonding pads.

18. The device of claim 9, wherein said ring is formed exclusively of a material also used to form said bonding pads.

19. The device of claim 1, wherein said ring and bonding pads are both formed directly on a surface of said substrate.

20. The device of claim 1, wherein said cover is sealed directly to said ring.

* * * * *